US005712502A

United States Patent [19]
Mitlehner et al.

[11] Patent Number: 5,712,502
[45] Date of Patent: Jan. 27, 1998

[54] SEMICONDUCTOR COMPONENT HAVING AN EDGE TERMINATION MEANS WITH HIGH FIELD BLOCKING CAPABILITY

[75] Inventors: Heinz Mitlehner, München; Dietrich Stephani, Bubenreuth; Ulrich Weinert, Hammerbach, all of Germany

[73] Assignee: Siemens Aktiengesellschaft, Munich, Germany

[21] Appl. No.: 619,688

[22] PCT Filed: Jul. 14, 1995

[86] PCT No.: PCT/DE95/00935

§ 371 Date: Mar. 27, 1996

§ 102(e) Date: Mar. 27, 1996

[87] PCT Pub. No.: WO96/03774

PCT Pub. Date: Feb. 8, 1996

[30] Foreign Application Priority Data

Jul. 27, 1994 [DE] Germany ............... 44 26 866.1

[51] Int. Cl.[6] ............... H01L 29/76; H01L 27/095; H01L 23/58
[52] U.S. Cl. ............... 257/341; 257/483; 257/484; 257/492; 257/493
[58] Field of Search ............... 257/77, 927, 928, 257/929, 279, 483, 484, 490, 492, 493, 495, 341

[56] References Cited

U.S. PATENT DOCUMENTS

| 4,157,563 | 6/1979 | Bosselaar ............... 257/489 |
| 4,259,678 | 3/1981 | van Gorkom et al. ............... 257/10 |
| 4,262,690 | 12/1980 | Temple . | |
| 4,374,389 | 2/1983 | Temple . | |
| 5,093,693 | 3/1992 | Abbas et al. . | |
| 5,233,215 | 8/1993 | Baliga . | |

FOREIGN PATENT DOCUMENTS

| 59 224170 | 12/1984 | European Pat. Off. . | |
| 0 159 544 | 10/1985 | European Pat. Off. . | |
| 0 311 816 | 4/1989 | European Pat. Off. . | |
| 0 380 340 | 8/1990 | European Pat. Off. . | |
| 7106085 | 7/1982 | Japan ............... 257/484 |
| 06 314791 | 11/1984 | Japan . | |
| 01 266760 | 10/1989 | Japan . | |

OTHER PUBLICATIONS

Neues Aus Deer Technik, Nr. 6, Dec. 1981, Wurzberg De, p. 3 "PN–Ubergang Mit Schutzring".
Baliga et al., Modern Power Devices, 1987, pp. 79–129.
Appl. Phys Lett. vol. 59, No. 14, Sep. 30, 1991, S. 1770–1772.

Primary Examiner—Tom Thomas
Assistant Examiner—Fetsum Abraham
Attorney, Agent, or Firm—Kenyon & Kenyon

[57] ABSTRACT

An n- or p-doped semiconductor region accommodates the depletion zone of an active area of the semiconductor component with a vertical extension dependent upon an applied blocking voltage. The junction termination for the active area is constituted with a semiconductor doped oppositely to the semiconductor region, and is arranged immediately adjacently around the active area on or in a surface of the semiconductor region. The lateral extension of the junction termination is greater than the maximum vertical extension of the depletion zone, and the semiconductor region as well as the junction termination are constituted with a semiconductor with a band gap of at least 2 eV.

28 Claims, 6 Drawing Sheets

SEMICONDUCTOR COMPONENT HAVING AN EDGE TERMINATION MEANS WITH HIGH FIELD BLOCKING CAPABILITY

FIELD OF THE INVENTION

The present invention relates to a semiconductor component.

BACKGROUND INFORMATION

A semiconductor component generally contains at least one active semiconductor area with one semiconductor region of n- or p-type conductivity as the drift region and two electrodes, associated with this drift region, for applying an operating voltage to the drift region, as well as generally further semiconductor regions for configuring component-specific semiconductor structures. With the component in a conductive state, the drift region carries the electrical current of charge carriers between the two electrodes. With the component in the blocked state, however, the drift region accommodates the depletion zone of a p-n junction or blocking metal/semiconductor contact (Schottky contact), constituted with the drift region, which forms as a result of the high (as compared with the conductive state) operating voltages that are then applied. The depletion zone is often referred to as the volume charge zone or blocking layer.

A distinction is made between unipolarly active and bipolarly active semiconductor areas. With unipolarly active semiconductor areas only one type of charge carriers, electrons or holes, defines operation; while with bipolarly active semiconductor areas both charge carrier types, i.e. electrons and holes, contribute to operation.

In the blocked state, comparatively high electric fields occur at the surface of the component. It must therefore be ensured that these electric fields at the surface transition in a stable fashion into the medium surrounding the component, with a maximum field strength that lies well below the breakdown field strength of the surrounding medium. The surrounding medium can be dielectric layers for isolation and/or passivation, or a surrounding gas, generally air. The problem of excessive field strengths at the surface of a component occurs in particular at high blocking voltages such as in the case of applications in power electronics, small dimensions with high field line curvatures, or high doping levels of semiconductor areas. To reduce field strengths at the surface of a component, a "junction termination" is used, which is produced in the surface of the component and surrounds the active area of the component. The function of a junction termination consists, in addition to electrical shielding of the active semiconductor area from the outside, in also reducing field line curvatures around the active semiconductor area in order to decrease excessive field strengths in the area near the surface inside the semiconductor component.

A variety of embodiments of junction terminations for p-n junctions in silicon-based high-voltage components are known from the book "Modern Power Devices" by B. J. Baliga, John Wiley and Sons (USA), 1987, pp. 79–129. P-n junctions of this kind are usually produced by diffusing a dopant into one surface of a silicon layer as the drift region, the diffused region being of the opposite conductivity type to the silicon layer. At the edge of the diffused region there occurs, because of the field line curvature and as a function of the depth of this region, an excessive field strength as compared to the planar p-n junction.

As is known, "floating field rings," which are produced annularly around the diffused region of the p-n junction in the silicon layer, also by diffusion, can be provided as the junction termination. These floating field rings are of the same conductivity type as the diffused region of the p-n junction, and are separated from one another by the oppositely doped silicon layer. One or more floating field rings can be provided.

A second method of obtaining a junction termination consists in taking away material, and therefore charges, around the edge of the p-n junction by mechanical removal or etching ("beveled-edge termination" or "etch contour terminations"). This produces mesa structures as the junction terminations.

A third known junction termination for a p-n junction is a "field plate." For this, an oxide layer and upon it a metal layer are applied onto an edge area around the p-n junction as the field plate. A field, with which the surface potential at the edge of the p-n junction is modified, is applied to the metal layer. As a result, the depletion zone of the p-n junction can also be expanded, and thus the field as well. The field plate can also be constituted with an electrode layer, associated with the p-n junction in order to apply an operating voltage, that overlaps the oxide layer in the edge area around the p-n junction. A junction termination can also be formed by a combination of floating field rings and field plates ("Modern Power Devices," page 119).

A fourth known embodiment of a junction termination is based on the process, complementary to the removal of charges, of controlled addition of opposite charges by ion implantation into the surface of the silicon layer provided as the drift region, and is referred to as "junction termination extension." The implanted region is of the same conductor type as the diffused semiconductor region, and therefore doped oppositely to the drift region, and has a lower doping level than the diffused region. Instead of being constituted with a region diffused into the drift region, the p-n junction can also be constituted with a silicon layer arranged on the surface of the drift region and doped oppositely to the drift region. Ion implantation of the junction termination then occurs at the edge of the two layers constituting the p-n junction. The p-n junction is in practice extended by this junction termination, the electric field is expanded, and field curvature is diminished. The breakdown resistance of the component is thus increased. This "junction termination extension" is proposed for bipolar transistors (BJTs), field-effect transistors (MOSFETs), and thyristors (SCRs—silicon controlled rectifiers) ("Modern Power Devices," page 128). Because of the additional parasitic diode created with this junction termination, considerable bipolar leakage currents occur due to charge carrier injection when the component is in the blocked state, especially in unipolar MOSFETs made of silicon. These leakage currents become even greater if the junction termination is enlarged, since charge carrier injection increases with surface area.

A further junction termination comparable to this "junction termination extension" is known from Swiss Application No. 659542, and is referred to there as a blocking layer elongation area. This junction termination is provided for a p-n junction as the bipolarly active semiconductor area of a semiconductor component, and can be produced by ion implantation or epitaxial growth. The lateral extension ($W_{JER}$) of the blocking layer elongation area is made greater than approximately half the depletion width ($W_{id}$) of the low-doped side of the p-n junction. At values for lateral extension ($W_{JER}$) greater than twice the depletion width ($W_{id}$), no further improvement occurs.

Silicon carbide (SiC) is a semiconductor material that is outstandingly suitable, because of its electrical and thermo properties, in particular for high-temperature and power electronics. In silicon carbide, for example, the maximum possible field strength (breakdown field strength) is higher by a factor of about 10, and geometrical dimensions can therefore be made smaller by a factor of about 10, than in silicon.

A power MOSFET constituted in silicon carbide as the semiconductor, with floating field rings and field plates as junction termination, is known from U.S. Pat. No. 5,233,215. The active area of the MOSFET is constituted with a p-doped first epitaxial layer on an n⁻-doped substrate and a second n⁺-doped epitaxial layer. The junction termination for the active area is configured as a mesa structure of the two epitaxial layers, produced by etching trenches that extend through the two epitaxial layers. Mesa structures as the junction termination, however, reduce the blocking voltage of the silicon carbide component made possible by doping of the semiconductor areas, due to high electric fields near the surface of the component. This increases the power dissipation in the component.

It is thus the object of the present invention to indicate a semiconductor component with a junction termination. The junction termination is intended not to substantially raise the leakage current of the component in its blocking state.

SUMMARY OF THE INVENTION

At least one semiconductor region of a first conductivity type is provided, preferably extended laterally in the direction of its surface. This semiconductor region accommodates, in an active area of the component in the blocking state, a depletion zone with a vertical (i.e. extending substantially perpendicular to the surface of the semiconductor region) extension dependent upon the blocking voltage, and is thus provided as the drift region. A junction termination for the active region is constituted with at least one further semiconductor region of the opposite conductivity type to the drift region accommodating the depletion zone, and is arranged immediately laterally adjacent to the active are, and surrounds the entire active area, one surface of the junction termination being in one plane with the surface of the drift region.

The lateral extension of the junction termination is greater than the maximum vertical extension of the depletion zone, i.e. the maximum depletion zone depth, in the drift region. According to the present invention, a comparatively large-area p-n junction, constituted between the junction termination and drift region, is thus incorporated into the semiconductor component. Due to the clearing of charge carriers out of the volume charge zone of this incorporated p-n junction, the electric field is expanded in the area of the surface of the drift region, and at the same time the active area of the semiconductor component is almost completely shielded from external charges and fields. An avalanche breakdown occurs reliably in the bulk material, remote from the surface of the semiconductor region. One particular advantage of the larger lateral extension of the junction termination as compared to the vertical extension of the depletion zone consists in the fact that the breakdown voltage of the semiconductor component is much less sensitive to fluctuations in doping or in general to the charge carrier concentration in the junction termination.

Semiconductors with a band gap of at least 2 eV are provided in each case as the semiconductors for the drift region and the junction termination. As a result, blocking-state currents when the semiconductor component is in the blocking state are kept low, in particular even at higher temperatures, since the parasitic diode formed by the junction termination and drift region is not activated even at high blocking voltages in the active area and at high temperatures, and as a result no minority charge carriers can be injected into the drift region. In addition, the voltage drop across a unipolarly active area in conductive mode remains below the voltage drop of the parasitic diode between the junction termination and drift region. The unipolar component can therefore be operated substantially without stored charge.

The combination of features according to the present invention provides an effective junction termination for electrical shielding of the active area of a semiconductor component, even at high blocking voltages.

By adjusting the vertical extension and/or the doping profile of the junction termination, the extension of the depletion zone of the p-n junction formed by junction termination and drift region, and thus the expansion of the electric field at the surface, can be further adapted in order to increase even further the breakdown resistance and adjustment tolerance of the semiconductor component.

A first embodiment of the semiconductor component according to the present invention provides that the lateral extension of the junction termination is greater by a factor of at least five than the maximum vertical extension of the volume charge zone accommodated by the semiconductor region.

In a second embodiment of the present invention, the junction termination comprises at least two semiconductor areas of different doping. As a result a softer, i.e. smoother, expansion of the electric field can be achieved. With a junction termination of this kind, doped in multiple stages, the semiconductor component is particularly robust with regard to manufacturing tolerances. The at least two semiconductor areas can be arranged vertically above one another, or laterally next to one another.

In a further embodiment of the present invention, the junction termination is grown epitaxially on the surface of the semiconductor region provided as the drift region. The junction termination can, however, also be produced by ion implantation. These two approaches to manufacturing the junction termination allow a precise adjustment of the doping profile, especially of the doping height, and of the depth (i.e. vertical extension) of the junction termination.

The junction termination according to the present invention can be used for a semiconductor component with a unipolarly active area, for example a metal-insulator semiconductor field effect transistor (MISFET) structure or a Schottky diode structure, or also for a semiconductor component with a bipolarly active areas, for example a p-n diode, or an IGBT, GTO, or thyristor structure.

In a further embodiment of the present invention, an electrical contact associated with the active area of the semiconductor component can also at least partially overlap the junction termination. As a result, the junction termination can be set to a defined potential.

Preferably the drift region and the junction termination are made of silicon carbide (SiC). This yields a component suitable for particularly high blocking voltages. Doping of the junction termination with boron is particularly advantageous in this embodiment. The blocking effectiveness of the junction termination is then particularly high.

DETAILED DESCRIPTION

Figure 1:
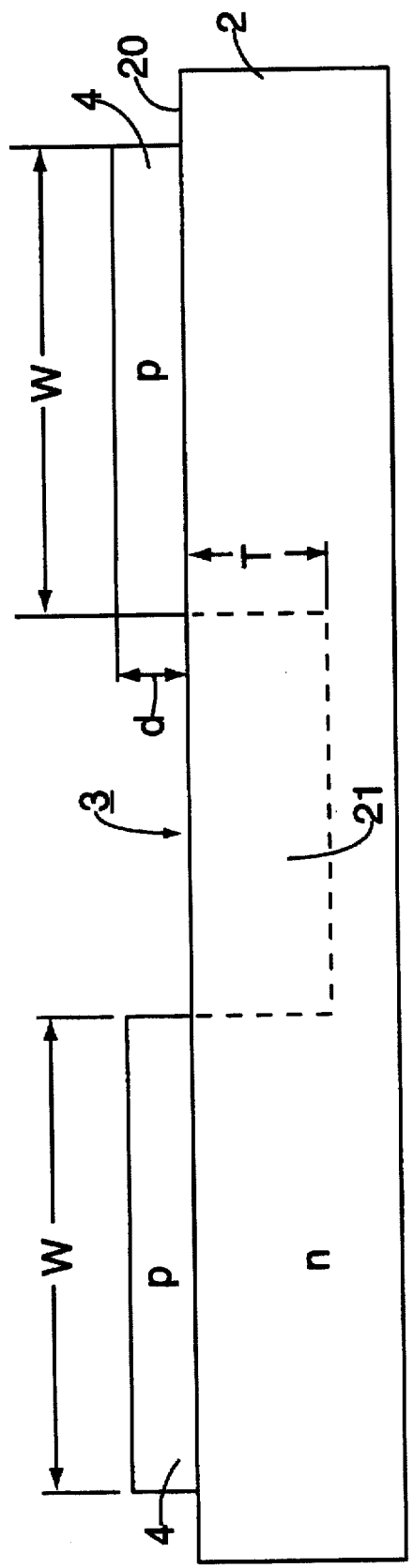
FIG. 1 illustrates a general structure of a semiconductor component with a junction termination, according to an embodiment of the present invention.

FIG. 1 shows, in cross section, the general structure of a semiconductor component with a junction termination according to the present invention. Reference symbols are 2 for a semiconductor region, 3 for an electronically active area, 4 for the junction termination for this active area 3, 20 for a surface of semiconductor region 2, and 21 for a depletion zone formed in semiconductor region 2.

Semiconductor region 2 constitutes the drift region of the semiconductor component, and accommodates, in active area 3 of the semiconductor component when the latter is in the blocking state, depletion zone 21 of active area 3. This depletion zone 21 can be the volume charge zone of a p-n junction, constituted in active area 3 with semiconductor region 2, between two semiconductors of opposite conductor type, or the blocking layer of a Schottky contact between a metal and a semiconductor. The vertical extension—i.e. oriented substantially perpendicular to surface 20 of semiconductor area 2—of depletion zone 21 is dependent on a blocking voltage applied in active area 3 by means of electrodes (not shown). The maximum vertical extension of depletion zone 21 corresponding to a predefined blocking voltage is labeled T. Semiconductor region 2 is of greater extent in at least one lateral direction—i.e. running substantially parallel to its surface 20—than in the vertical direction. Semiconductor region 2 is generally arranged on a substrate (not shown), for example an epitaxially grown semiconductor layer.

Junction termination 4 for active area 3 of the semiconductor component is arranged on surface 20 of semiconductor region 2. Junction termination 4 is immediately laterally adjacent to active area 3, and surrounds the entire active area 3. The lateral extension of junction termination 4, labeled W, is greater than the maximum vertical extension T of depletion zone 21 in semiconductor region 2. Preferably, lateral extension W of junction termination 4 is at least five times as great as the maximum vertical extension T of depletion zone 21. For a depletion zone extension T of, for example 10 μm, lateral extension W of junction termination 4 is preferably made to be between 50 μm and 150 μm. Vertical extension d of junction termination 4 is preferably substantially constant.

Furthermore, junction termination 4 is constituted with at least one semiconductor of the opposite conductivity type to semiconductor region 2. In the embodiment depicted, semiconductor region 2 is n-type conductive, and junction termination 4 is p-type conductive, with a p-type conductive semiconductor region 2, on the other hand, an n-type conductive junction termination 4 is to be provided. Preferably, junction termination 4 is produced by ion implantation of dopant particles into surface 20 of semiconductor region 2, or by growing onto surface 20 of semiconductor region 2 an epitaxial layer to be correspondingly doped.

Semiconductor region 2 and junction termination 4 are each constituted with at least one semiconductor with a band gap of at least 2 eV. Suitable semiconductor materials are, for example, boron nitride (BN), boron phosphide (BP), aluminum phosphide (ALP), gallium phosphide (GAP), zinc sulfide (ZnS), or diamond (C). Silicon carbide (SiC) in all its polytypes, but in particular the 6H, 4H, and 3C polytype, is particularly suitable because of its outstanding electronic properties.

With a junction termination 4 as shown in FIG. 1, a comparatively large-area p-n junction is incorporated into the semiconductor component in the area of surface 20 of semiconductor region 2. The volume charge zone of this p-n junction that forms with the semiconductor component in the blocking state on the one hand shields active area 3 and semiconductor region 2 from electric fields and charges from outside the component, and on the other hand leads to an expansion of the electric field in the area of surface 20. The breakdown resistance of the component is thus raised, and higher blocking voltages can be applied to active area 3. Because of the high band gap (at least 2 eV), as compared with silicon (Si), of the semiconductor or semiconductors used, the large-area p-n diode constituted with junction termination 4 and semiconductor region 2 has a high built-in voltage and is not activated even at high blocking voltages. Junction termination 4 therefore generates essentially no additional blocking currents in the semiconductor component. The achievable blocking voltages are therefore much higher than in silicon. The built-in voltage of a p-n junction configured in SiC is, for example, greater than approximately 2.6 V.

Figure 2:
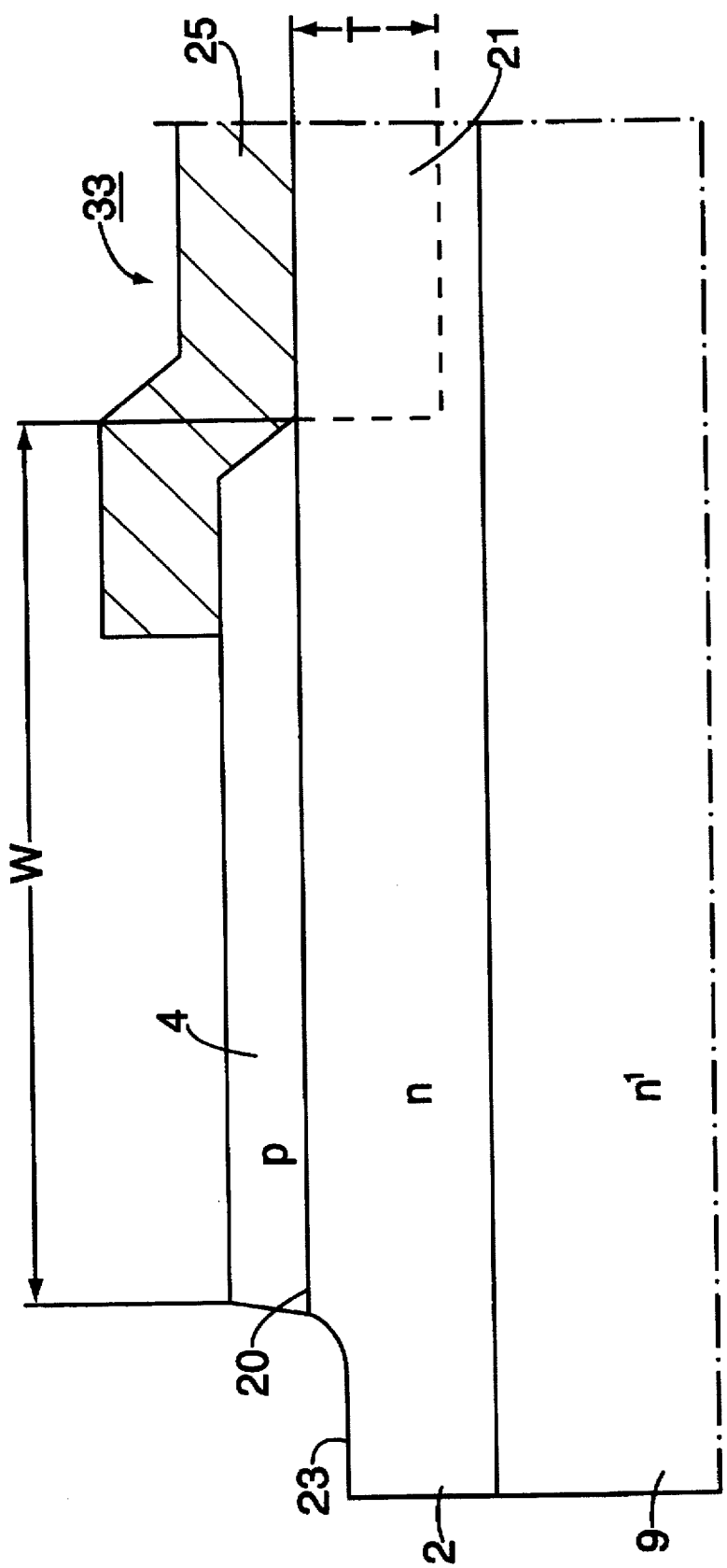
FIG. 2 illustrates a semiconductor component with a junction termination for a Schottky diode structure, according to another embodiment of the present invention.

FIG. 2 depicts, in cross section, part of an embodiment of a semiconductor component with at least one Schottky diode structure 33 as the unipolarly active area. Arranged on a substrate 9 made of an n-doped semiconductor is an epitaxially grown semiconductor layer, also n-doped, as the semiconductor region 2. This epitaxial layer is generally less doped than substrate 9. Substrate 9 does not need to consist of a semiconductor with a high band gap, and can, for example, also be constituted with silicon, especially if semiconductor region 2 is constituted with silicon carbide. Schottky diode structure 33 contains a contact 25, arranged on surface 20 of semiconductor region 2 and generally metallic, as the Schottky contact. The blocking layer of Schottky diode structure 33 that forms beneath contact 25 in semiconductor region 2 when a blocking voltage is applied constitutes depletion zone 21 in the active region of the semiconductor component. An epitaxially grown p-doped semiconductor layer is arranged on semiconductor region 2, immediately adjacent to contact 25, as the junction termination 4. The semiconductor layer constituting junction termination 4 is of considerably greater extension in its layer plane (lateral extension W) than the layer thickness of semiconductor region 2, and therefore also than the maximum vertical extension T of depletion zone Junction termination 4 can extend as far as the edge of semiconductor region 2. Contact 25 is preferably also arranged on a portion of junction termination 4 (overlapping contact). In addition, semiconductor region 2 and junction termination 4 can also be equipped at their outer edges, facing away from the active region, with a recess 23, for example a beveled-etch edge. When silicon carbide is used as the semiconductor for Schottky diode structure 33 and its junction termination 4, blocking voltages of up to 1200 V can be applied, for example at a doping of $n=10^{16}$ cm$^{-3}$ for semiconductor region 2. In conductive mode, the voltage drop between contact 25 and a further electrode (not shown) in Schottky diode structure 33 remains below the voltage drop of the parasitic p-n diode between junction termination 4 and semiconductor region 2. This ensures that the unipolar component operates substantially without stored charge.

Figure 3:
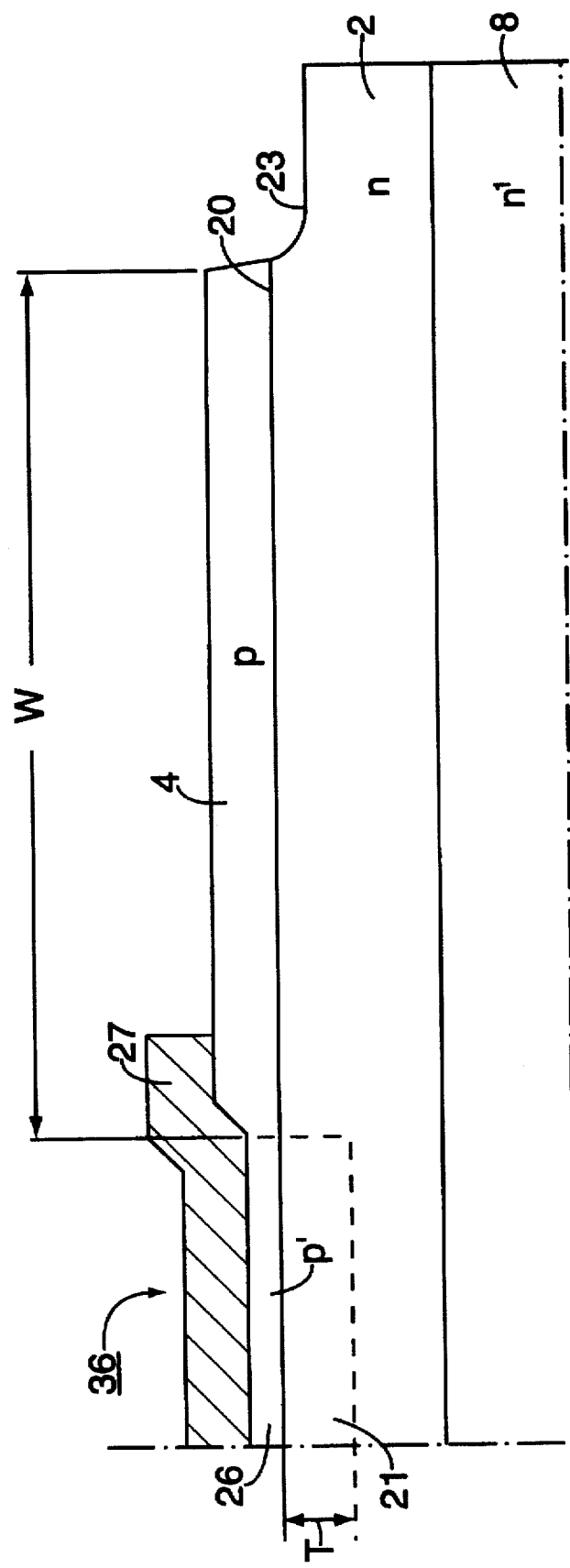
FIG. 3 illustrates a semiconductor component with a junction termination for a p-n diode structure, according to the present invention.

A portion of a semiconductor component with at least one p-n diode structure 36 as the bipolarly active area is shown in cross-section in FIG. 3. Semiconductor region 2 is grown epitaxially on a semiconductor substrate 9, and is of the same conductivity type (n-type) as substrate 9. The p-n junction of p-n diode structure 36 is constituted with the n-type semiconductor region 2 and a p-type semiconductor region 26, preferably epitaxially grown, on surface 20 of semiconductor region 2. Arranged on this p-type semiconductor region 26 is an ohmic contact 27. In this case the volume charge zone of the p-n junction of p-n diode structure 36 constitutes depletion zone 21 of the active area. A p-type semiconductor layer, preferably epitaxially grown onto surface 20 of semiconductor area 2, is provided as junction termination 4 for p-n diode structure 36. This semiconductor layer of junction termination 4 is directly adjacent to the p-type semiconductor region 26 of p-n diode structure 36. Ohmic contact 27 can again partially overlap junction termination 4.

In addition, a recess 23 can again be provided at the edge of semiconductor region 2. Ion-implanted semiconductor regions can of course also be provided instead of epitaxially grown semiconductor regions.

Figure 4:
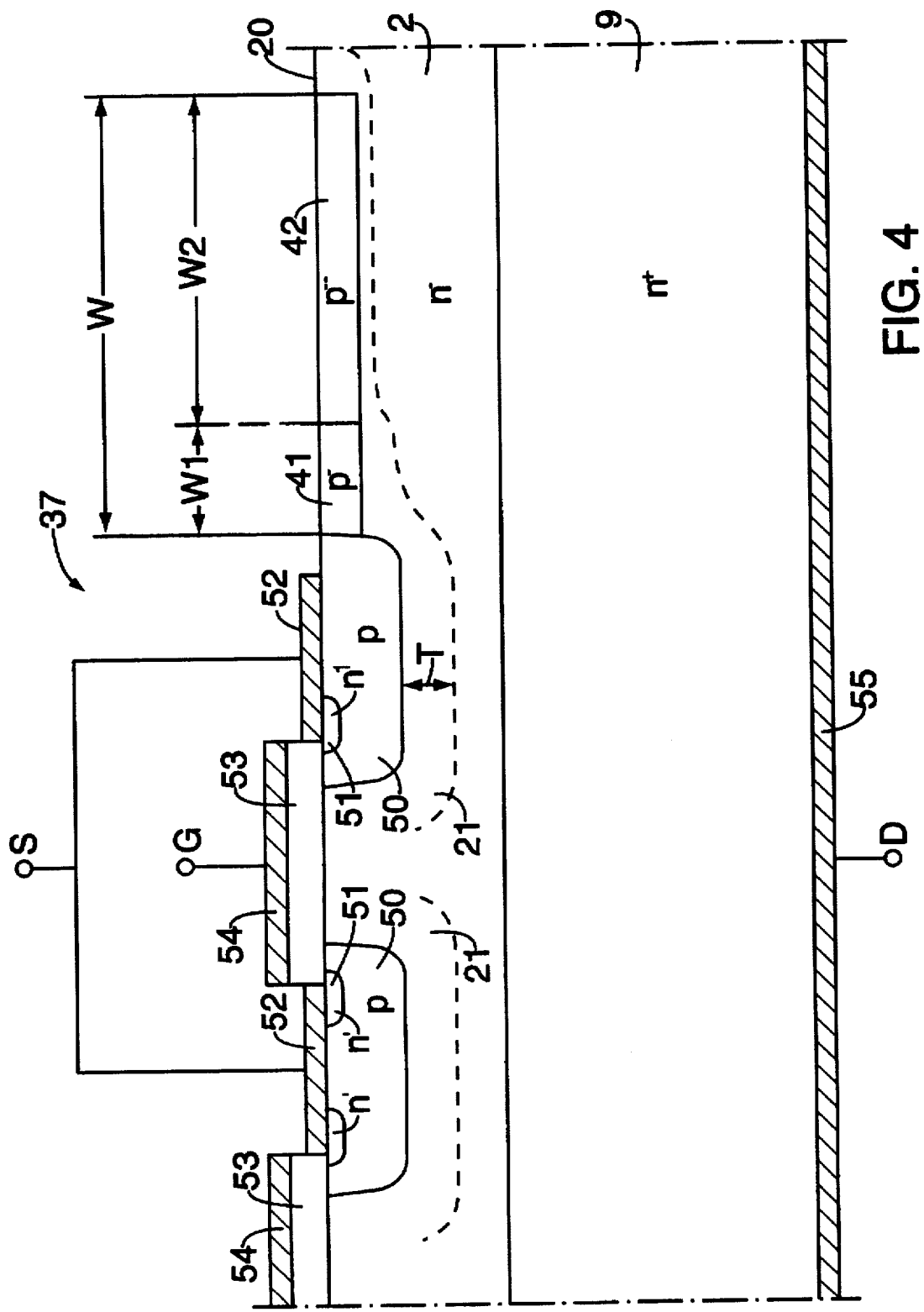
FIG. 4 illustrates a semiconductor component with a junction termination with two differently doped semiconductor areas for a MISFET structure, according to yet another embodiment of the present invention.

FIG. 4 illustrates a semiconductor component with at least one MISFET structure 37 as another embodiment of the present invention with a unipolarly active area. The n-doped semiconductor region 2 arranged on the $n^+$-doped substrate 9 represents the drift region of MISFET structure 37. MISFET structure 37 comprises at least one p-doped base region 50 generated in surface 20 of semiconductor region 2 by ion implantation or diffusion; at least one source region 51 generated within base region 50, also by ion implantation or diffusion; at least one source electrode 52 of source S, by means of which source region 51 and base region 50 are electrically short-circuited; a gate electrode 54 of gate G (insulated gate), electrically insulated by means of an insulator layer 53 and arranged above a channel region of base region 50 that connects source region 51 and semiconductor region 2; and a drain electrode 55 of drain D arranged on the side of substrate 9 facing away from semiconductor region 2. Depletion zone 21 of the p-n junction constituted between base region 50 and semiconductor region 2, accommodated by semiconductor region 2, is indicated schematically. MISFET structure 37 can, as shown in FIG. 4, be made up of individual cells each with a base region 50 and at least one source region 51, with associated source electrode 52 and insulated gate electrodes 54 bridging the individual Cells. Junction termination 4 for MISFET structure 37 is immediately adjacent to base region 50 located at the outer edge of MISFET structure 37, and is, like base region 50, doped oppositely to semiconductor region 2. Junction termination 4 is preferably produced by ion implantation of dopant particles into surface 20 of the semiconductor region. Junction termination 4 and/or base region 50 of MISFET structure 37 can, however, also be epitaxial layers.

In the embodiment of the present invention as shown in FIG. 4, junction termination 4 is made up of at least two differently doped semiconductor regions 41 and 42. These two semiconductor regions 41 and 42 are arranged laterally next to one another on surface 20 of semiconductor region 2, and preferably are either both implanted or diffused, or both epitaxially grown. Preferably both semiconductor regions 41 and 42 have approximately the same vertical extension. Semiconductor region 41 immediately alongside MISFET structure 37 has lower doping (p-) than adjoining base region 50 of MISFET structure 7, and higher doping than the $p^-$-doped semiconductor region 2 that is laterally adjacent on the side facing away from said base region 50. A junction termination 4 with a graduated doping is thus obtained. In an advantageous embodiment of the present invention, lateral extension W1 of first semiconductor region 41 is made smaller than lateral extension W2 of second semiconductor region 42. The total lateral extension W of junction termination 4 is then the sum of the individual extensions W1 and W2 of the two semiconductor regions 41 and 42. This total lateral extension W of junction termination 4 is again made greater than the maximum vertical extension T of depletion zone 21 of MISFET structure 37.

In yet another embodiment of the present invention (not shown), the two semiconductor regions 41 and 42 can be arranged vertically above one another. A vertical structure of this time can, for example, be produced by ion implantation or diffusion with differing penetration depths, or by epitaxially growing the semiconductor regions sequentially above one another. The semiconductor region arranged below then advantageously has lower doping than the semiconductor region arranged below. Lateral extension W of the junction termination is then determined substantially by the greatest lateral extension of the individual semiconductor regions arranged vertically above one another. Preferably the lateral extensions of all the semiconductor regions are at least approximately the same size.

Furthermore, the junction termination can also consist of a lateral or a vertical arrangement of more than two semiconductor regions, each differently doped, such that the doping preferably decreases laterally outward or vertically downward.

Multistage junction terminations of this kind are not confined to semiconductor components with MISFET structures, but can also be provided for all other semiconductor components. These junction terminations with multistage doping have the advantage that the electric field in the vicinity of surface 20 of semiconductor region 2 assumes a smoother profile outward from the active region.

It is understood that in all the embodiments of the present invention described so far, the conductivity types of all semiconductor regions can be respectively reversed.

Figure 5:
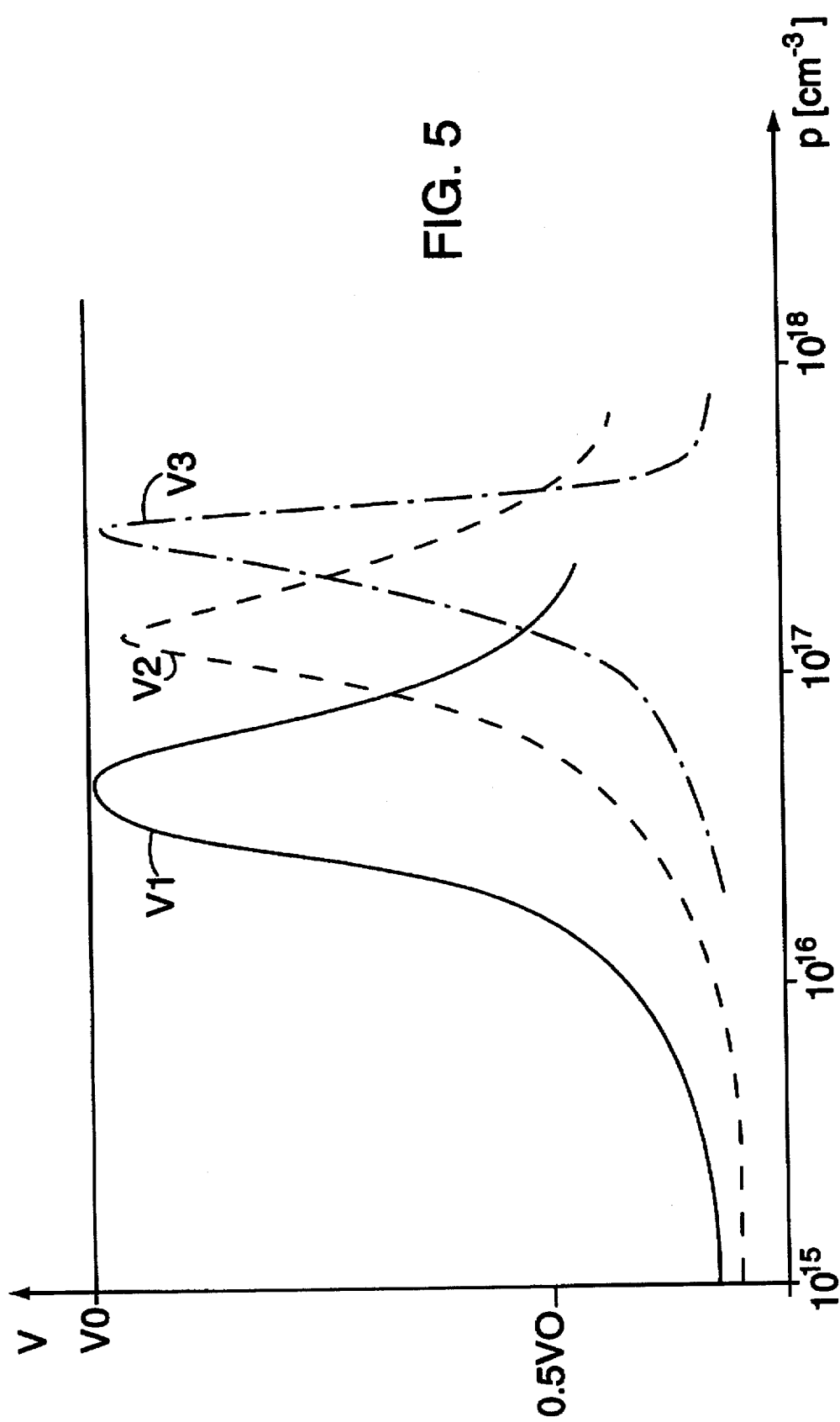
FIG. 5 illustrates a diagram of breakdown voltage as a function of doping of the junction termination.
Figure 6:
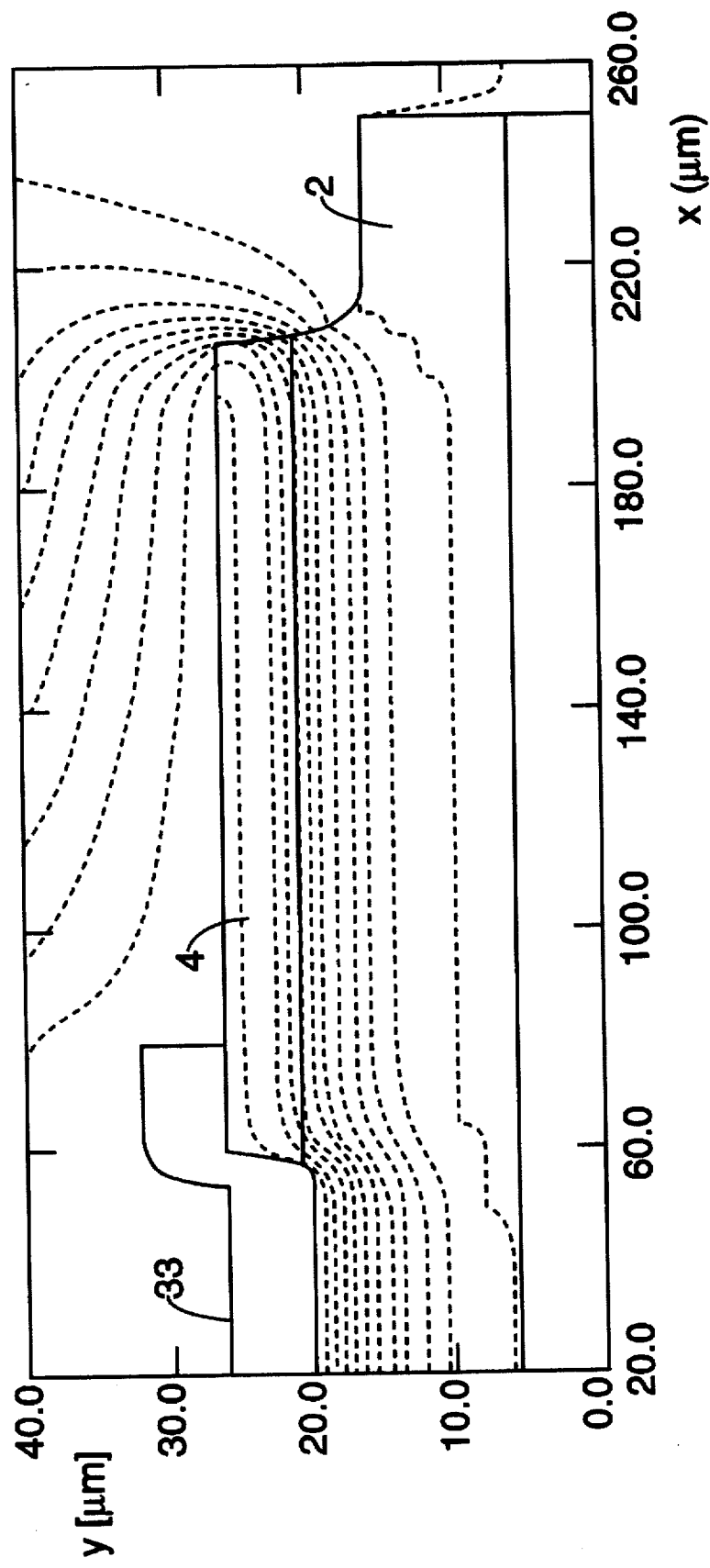
FIG. 6 illustrates a field distribution in a semiconductor component with a Schottky diode structure.

FIGS. 5 and 6 show the results of numerical, computer-aided simulations of semiconductor components with junction terminations according to the present invention. The calculations are based on SiC as the semiconductor material for the semiconductor component.

As shown in FIG. 5, the breakdown voltage V of the semiconductor component is plotted as a function of the logarithmically plotted doping level p of the (single-stage) junction termination 4 of the semiconductor component, using three different vertical extensions d of junction termination 4 as parameters and for a predefined lateral extension W of junction termination 4. The solid curve labeled V1 corresponds to a vertical extension d=2 µm, dashed curve V2 to a vertical extension d 3D 0.7 µm, and dot-dash curve V3 to a vertical extension d 3D 0.3 µm of junction termination 4. Each of the three curves shows pronounced maxima in a certain doping range. In the vicinity of these maxima, breakdown voltage V of the semiconductor component is practically equal to the ideal, theoretically possible breakdown voltage V0 in the bulk material of the semiconductor component. As vertical extension d of junction termination 4 decreases, the maxima are shifted toward higher doping levels and become broader (note the logarithmic plot used for doping level p). By adjusting vertical extension d of junction termination 4, it is thus possible to make the semiconductor component more robust in terms of manufacturing tolerances during doping of junction termination 4.

The qualitative plot of breakdown voltage V as a function of doping p (or n) of junction termination 4 depicted in FIG. 5 is largely independent of the structure of the active area, and also of the doping of semiconductor region 2 of the semiconductor component, and can be observed with the embodiments according to FIGS. 1 to 4.

Vertical extension d of junction termination 4 is typically between 0.1 μm and 5 μm.

FIG. 6 shows a field distribution that is possible with junction termination 4 according to the present invention, using the example of a semiconductor component with a Schottky diode structure 33 shown in FIG. 2. The scales plotted on the x and y axes indicate size relationships and dimensions. The electric field lines are drawn with dashed lines.

When silicon carbide (SiC) is used as the semiconductor material, junction termination 4 is preferably p-doped with boron (B) or with aluminum (Al), or n-doped with nitrogen (N). Boron (B) is particularly advantageous as a dopant for junction termination 4, since the boron atoms form deep acceptor levels in SiC. In this embodiment of the present invention, junction termination 4 can handle particularly high blocking voltages.

In all embodiments, additional passivation layers made of dielectric or semi-insulating materials can be provided in addition to junction termination 4. With a semiconductor component based on SiC, the passivation layers can in particular consist of amorphous SiC, silicon (Si), or carbon (c).

What is claimed is:

1. A semiconductor component comprising:
   at least one semiconductor region including at least one first semiconductor having a first conductivity type, the at least one semiconductor region having a region width and a region height, the region width being greater than the region height;
   an active area including a depletion zone extending into the at least one semiconductor region and having a depletion zone height being dependent on a blocking voltage applied to the active area; and
   a junction termination member having a junction termination width and including at least one second semiconductor having a second conductivity type which is opposite in polarity to the first conductivity type, the junction termination member surrounding and positioned laterally adjacent to the active area, the junction termination member having a junction surface which is coplanar with a semiconductor region surface of the semiconductor region,
   wherein the junction termination width of the junction termination member is greater than the depletion zone height of the depletion zone, and wherein the first semiconductor and the second semiconductor each have a band gap of at least 2 eV.

2. The semiconductor component according to claim 1, wherein the junction termination width of the junction termination member is at least five times as large as the depletion zone height of the depletion zone.

3. The semiconductor component according to claim 1, wherein the junction termination member is epitaxially grown on the surface of the semiconductor region.

4. The semiconductor component according to claim 1, wherein the junction termination member is formed by ion implantation.

5. The semiconductor component according to claim 1, further comprising an electrical contact associated with the active area, the electrical contact at least partially overlapping the junction termination member.

6. The semiconductor component according to claim 1, wherein the active area is a unipolar active area.

7. The semiconductor component according to claim 1, wherein the active area is a bipolar active area.

8. The semiconductor component according to claim 1, wherein the first and the second semiconductors include silicon carbide.

9. The semiconductor component according to claim 8, wherein the junction termination member is doped with boron.

10. The semiconductor component according to claim 1, wherein the at least one second semiconductor has a first doping level and provides a maximum reverse blocking voltage at an optimum doping level corresponding to the first doping level, the first doping level being between one-third of the optimum doping level and three-times the optimum doping level.

11. The semiconductor component according to claim 1, wherein the junction termination member includes a junction height, the junction height being less than one μm.

12. A semiconductor component comprising:
   at least one semiconductor region including at least one first semiconductor having a first conductivity type, the at least one semiconductor region having a region width and a region height, the region width being greater than the region height;
   an active area including a depletion zone extending into the at least one semiconductor region and having a depletion zone height being dependent on a blocking voltage applied to the active area; and
   a junction termination member having a junction termination width and including at least one second semiconductor having a second conductivity type which is opposite in polarity to the first conductivity type, the junction termination member surrounding and positioned laterally adjacent to the active area, the junction termination member having a junction surface which is coplanar with a semiconductor region surface of the semiconductor region,
   wherein the junction termination width of the junction termination member is greater than the depletion zone height of the depletion zone, and wherein the first semiconductor and the second semiconductor each have a band gap of at least 2 eV, and
   wherein the junction termination member includes a plurality of semiconductor areas each having a different doping.

13. The semiconductor component according to claim 12, wherein the plurality of semiconductor areas includes first and second semiconductor areas, the first semiconductor area being arranged laterally next to the second semiconductor area.

14. The semiconductor component according to claim 12, wherein the plurality of semiconductor areas includes first and second semiconductor areas, the first semiconductor area being arranged above the second semiconductor area.

15. A semiconductor component comprising:
   at least one active area including a depletion zone, the depletion zone having a depletion zone vertical extension being dependent on a blocking voltage applied to the at least one active area;

at least one semiconductor region of a first conductivity type extending in a lateral direction and in a vertical direction, the depletion zone extending into the at least one semiconductor region, the at least one semiconductor region extending further in the lateral direction than in the vertical direction, the vertical direction being perpendicular to the lateral direction; and a junction termination member associated with the active area, the junction termination member including at least one semiconductor of a second conductivity type which is opposite in polarity to the first conductivity type, the junction termination member surrounding positioned laterally adjacent to the at least one active area, the junction termination member having a junction surface which is coplanar with a semiconductor region surface of the semiconductor region, wherein the junction termination member includes a junction lateral extension, the junction lateral extension being larger than the depletion zone vertical extension of the depletion zone, and wherein the semiconductor region and the junction termination member are each formed with at least one second semiconductor, the semiconductor region and the junction termination each having a band gap of at least 2 eV.

16. The semiconductor component according to claim 15, wherein the junction lateral extension of the junction termination member is at least five times as large as the depletion zone vertical extension of the depletion zone.

17. The semiconductor component according to claim 15, wherein the junction termination member is epitaxially grown on the surface of the semiconductor region.

18. The semiconductor component according to claim 15, wherein the junction termination member is formed by ion implantation.

19. The semiconductor component according to claim 15, further comprising an electrical contact associated with the at least one active area, the electrical contact at least partially overlapping the junction termination member.

20. The semiconductor component according to claim 15, wherein the at least one active area is a unipolar active area.

21. The semiconductor component according to claim 15, wherein the at least one active area is a bipolar active area.

22. The semiconductor component according to claim 15, wherein the semiconductor region and the junction termination include silicon carbide.

23. The semiconductor component according to claim 22, wherein the junction termination member is doped with boron.

24. The semiconductor component according to claim 15, wherein the at least one second semiconductor has a first doping level and provides a maximum reverse blocking voltage at an optimum doping level corresponding to the first doping level, the first doping level being between one-third of the optimum doping level and three-times the optimum doping level.

25. The semiconductor component according to claim 15, wherein the junction termination member includes a junction height, the junction height being less than one μm.

26. A semiconductor component comprising:

at least one active area including a depletion zone, the depletion zone having a depletion zone vertical extension being dependent on a blocking voltage applied to the at least one active area;

at least one semiconductor region of a first conductivity type extending in a lateral direction and in a vertical direction, the depletion zone extending into the at least one semiconductor region, the at least one semiconductor region extending further in the lateral direction than in the vertical direction, the vertical direction being perpendicular to the lateral direction; and a junction termination member associated with the active area, the junction termination member including at least one semiconductor of a second conductivity type which is opposite in polarity to the first conductivity type, the junction termination member surrounding and positioned laterally adjacent to the at least one active area, the junction termination member having a junction surface which is coplanar with a semiconductor region surface of the semiconductor region, wherein the junction termination member includes a junction lateral extension, the junction lateral extension being larger than the depletion zone vertical extension of the depletion zone, and wherein the semiconductor region and the junction termination member are each formed with at least one second semiconductor, the semiconductor region and the junction termination each having a band gap of at least 2 eV, and wherein the junction termination member includes a plurality of semiconductor areas each having a different doping.

27. The semiconductor component according to claim 26, wherein the plurality of semiconductor areas includes first and second semiconductor areas, the first semiconductor area being arranged laterally next to the second semiconductor area.

28. The semiconductor component according to claim 26, wherein the plurality of semiconductor areas includes first and second semiconductor areas, the first semiconductor area being arranged above the second semiconductor area.

* * * * *